June 23, 1959 R. R. SCOVILLE 2,892,009

CASE FOR ELECTRONIC MODULAR UNITS

Filed Nov. 26, 1954 2 Sheets-Sheet 1

INVENTOR.
RAY R. SCOVILLE

BY Nicholas T. Volk

ATTORNEY

June 23, 1959 R. R. SCOVILLE 2,892,009

CASE FOR ELECTRONIC MODULAR UNITS

Filed Nov. 26, 1954 2 Sheets-Sheet 2

INVENTOR.
RAY R. SCOVILLE
BY Nicholas T. Volsk
ATTORNEY

United States Patent Office 2,892,009
Patented June 23, 1959

2,892,009

CASE FOR ELECTRONIC MODULAR UNITS

Ray R. Scoville, La Canada, Calif.

Application November 26, 1954, Serial No. 471,296
5 Claims. (Cl. 174—52)

This invention relates to electronic assemblies and more particularly to case-mounted modular units of such assemblies.

Modular units in electronic assemblies in many instances must be mechanically self-contained units including thermionic tubes, tube sockets, means for mounting circuit components, multiple prong plugs for connecting these units to larger units, and cases or boxes providing the outer walls and shielding means for the units. The invention discloses the units of the above type integrated into compact, modular structures.

Modular electronic units are now an accepted structural or layout standard in a larger part of electronic industry. Such units include printed circuits, printed circuit assemblies, and a large number of integrated electronic structures including a plurality of vertical or horizontal panels with electronic components mounted in a variety of ways on or between the panels. One example of such units is disclosed in the application for patent of the same inventor filed April 12, 1955, having a Serial No. 500,850, and entitled "Electronic Modular Units." Structures of this type often require an external housing means providing a mechanical packaging and shielding means for such units. The invention discloses novel external packaging means for electronic units, and means for integrating the disclosed packaging units or cases with modular electronic units. The disclosed cases provide greater accessibility, simplicity and utility than similar casts of the prior art, and can be integrated or used with the modular electronic units more readily and more advantageously than the known cases by providing greater accessibility, to the electronic components by being readily dismounted and completely separated from the electronic components, and by also providing panel space on the inner surfaces of the housing for mounting electronic components.

It is therefore, an object of this invention to provide improved case-enclosed modular electronic units.

An additional object of this invention is to provide novel case-enclosed electronic modular units in which the case consists of two covers and L-shaped or U-shaped side-walls held together with two corner studs.

Still another object of this invention is to provide novel case-enclosed electronic modular units in which all electronic components are integrated into one unit which is surrounded by a case having two covers, two U-shaped side-members, two slidable side panels, and two studs for holding the case together.

Still another object of this invention is to provide case-enclosed electronic modular units of great flexibility, compactness, accessibility, and having self-locking features.

In providing for the foregoing objects and advantages, the modular units in accordance with this invention, comprise an electronic assembly per se and the case surrounding it. The electronic assembly may take a variety of forms, but, in general, it includes tubes, tube sockets, tube shields and shield bases, a plurality of socket turrets, or deck or wall turrets having a plurality of horizontal or vertical insulation strips held in spaced relationship with respect to each other by riser wires or other means with the circuit components mounted either parallel or perpendicular to the strips. The turrets are provided with multiple plug prongs, the prongs and the tube sockets being connected to the turrets. This electronic assembly is surrounded with a case which may take several forms: all forms have rectangular top and bottom covers; between these two covers there are four side-walls with rounded corners. The four side-walls of the case may comprise two L-shaped pieces, each leg of the L-shaped member constituting a wall, as illustrated in Fig. 4, the two L pieces defining a rectangle; the side-walls may also be shaped as two U-shaped end pieces with two flat side-panels completing an outline of a rectangle; as illustrated in Fig. 3, or the three side-walls may comprise one piece closed off with one side-panel, as illustrated in Fig. 5. The side-panel or panels are demountable without taking apart the remaining parts of the case, which gives a ready access to the electronic assembly mounted within the case. The entire case can be put around the electronic assembly and taken apart without disturbing the electronic assembly. All side-walls of the casing may be made of perforated material, as illustrated in Fig. 6, to provide ample ventilation for the electronic assembly. The casing is held together by two corner posts, internally threaded at the ends to receive screws with the result that loosening of two screws permits dismantling the case and separating it from the electronic assembly.

The foregoing objects, advantages and construction of the present invention will be more readily seen from the following description and accompanying drawings in which.

Figure 1:
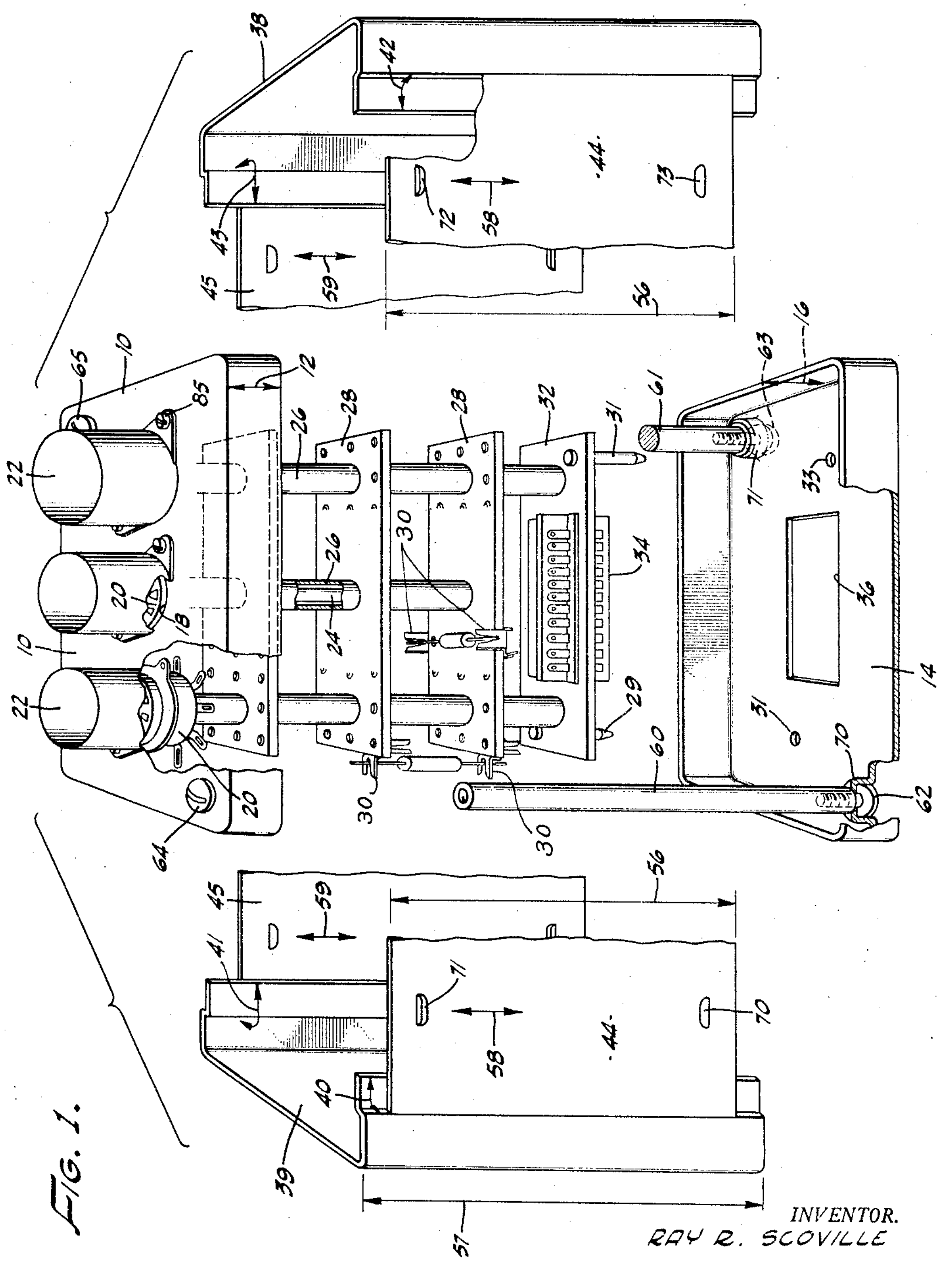
Figure 1 is an exploded perspective view of an electronic modular unit mounted in a case.
Figure 2:
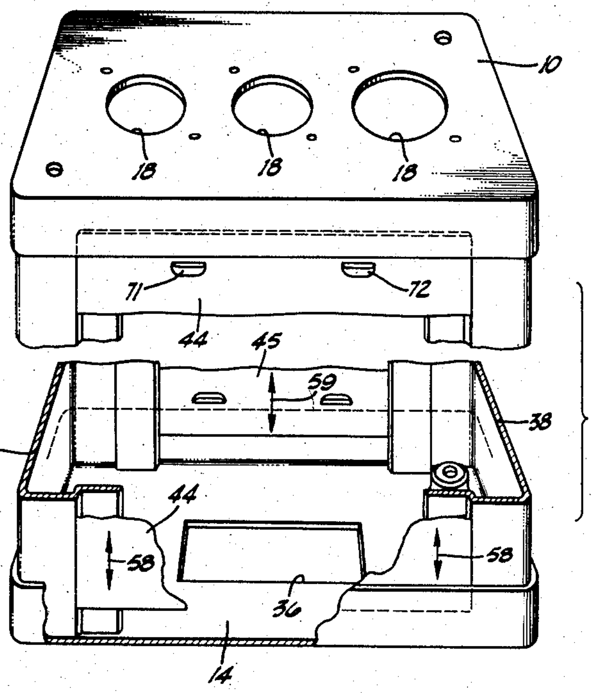
Figure 2 is a perspective view, partly in section, of a mounting case.
Figure 3:
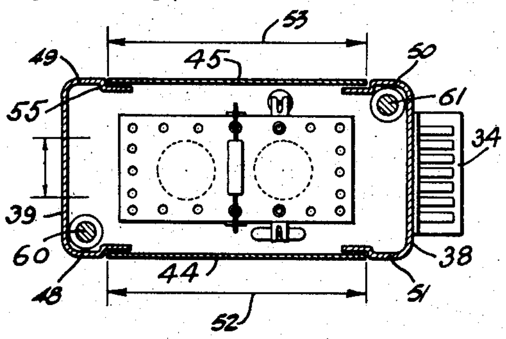
Figures 3, 4 and 5 are plan sectional views of mounting cases.

Referring to Figs. 1, 2 and 3, where the same elements have the same numbers, and which illustrate, by the way of an example, a deck-type electronic assembly, having a plurality of insulation plates, or strips, 28 for mounting electronic components, mounted in a case, the case comprises a top cover 10 having four bent-over side-edges, or side flanges, 12 and a bottom cover 14 with four side-edges, or side flanges, 16. The two covers have identical outside dimensions. The top cover may have a plurality of circular openings 18 for inserting and mounting tube sockets 20 in usual manner as illustrated in Fig. 1. The top cover also may be used for mounting shield bases 22 which are fastened to the cover by screws 85. Centrally located holes in the tube sockets are used for mounting bolts 24 which are surrounded with insulating sleeves 26 which also act as spacers for mounting insulating strips 28 provided with terminals 30 for mounting circuit components in planes parallel to the strips or at right angles to the strips. The bottom strip 32 is provided with a multiple prong plug 34 attached to strip 32. The bottom cover 14 is provided with an opening 36 for accommodating the prong portion of plug 34 and orifices 31 and 33 for accommodating guide prongs 29 and 31 attached to strip 32. The case also includes two U-shaped sidewall channels 38 and 39, each channel being provided with inwardly offset rabbets 40, 41, 42 and 43, the rabbets lying in a single plane being used for receiving a correspondingly positioned sliding side-panel, such as side-panels 44 and 45. The depth of the offset for the flanges 40—43 is equal to the thickness of the panel members 44 and 45, as illustrated in Fig. 3, with the result that the outside surfaces of the panels and adjacent surfaces 48, 49, 50 and 51 of the U-shaped members lie in the same respective planes. The horizontal dimensions 52 and 53 of the panels (see Fig. 3) are substantially equal to the horizontal dimensions between the inner edges of the surfaces 48 and 51, and 49 and 50, respectively, so that the panel and the bent over portions of the U-shaped members present a substantially continuous smooth surface, with the offsets, such as 55 in Fig. 3, acting as guide edges for the sliding panels 44 and 45. The vertical dimensions of the side-panels, such as 56 in Fig. 1, is less than the vertical dimension 57 of the U-shaped members 38 and 39 with the result that the side-panels can slide up and down along the rabbets, as illustrated by arrows 58 and 59 in Figs. 1 and 2. The vertical dimension 56 is made approximately equal to the vertical spacing between the inner surfaces of the top and bottom covers minus the height of one side-edge 12 or 16. Therefore, the side-panels extend approximately half-way across the vertical dimensions 12 and 16 of the side-edges, as illustrated in Fig. 2, when the side-panels are in the positions closing off the sides of the case. Stated differently, the upper halves of the cover edges overlap the side-panels in the manner illustrated in Fig. 2. The case is held together by two posts 60 and 61 internally threaded at the ends to receive screws 62, 63, 64 and 65, the posts being placed at diagonally opposite corners. The length of the bolts is equal to the height of the U-shaped members 39—38 indicated by the dimensional line 57 reduced by the vertical dimension of the dimples 70 and 71. The bottom cover is dimpled inwardly for recessing the holding screws 62 and 63 so that the multi-prong plug 34 can engage its corresponding member without interference of the set-screws.

The entire case is assembled by first attaching the electronic assembly to cover 10 which is accomplished by means of set screws 85; rods 60 and 61 are then attached to the bottom cover 14 by set-screws 62 and 63; the U-shaped members 38, 39 and side-panels 44 and 45 are then placed in proper relationship on cover 14 and the case is locked in place by means of two set-screws 64 and 65. From the above it follows that the entire case may be dismantled and removed from the electronic assembly, except for cover 10, by loosening only two set-screws 64 and 65. Panels 44 and 45 are then slipped in place by sliding them first all the way up under the upper edge and then sliding them in under the lower edge. The electronic assembly can be made accessible also by sliding the side-panels up or down and then pulling them out altogether, with the result that two sides of the electronic assembly become accessible for inspection, testing etc. The side-panels are thus made removable, which is made possible by making the panel's height 56 less than the height 57 of the U-shaped members, and by providing the U-shaped members with the flange and rabbet portions 40—43 which act as two springs that can be depressed inwardly for sliding the side-panels, and especially side-panel detents 70, 71, 72 and 73 under the cover edges 12 or 16, respectively, in the process of removing the covers. Each side-panel is provided with four detents 70–73 which normally hold it in place against any upward or downward sliding. Therefore, in order to remove the side-panel, the panel is depressed inwardly, the side flanges acting as two springs permitting the inward depression of the panel, so that the detents can be pushed under the adjacent edge of the cover until one edge of the panel abuts against the inner surface of this cover. When the panel is slid into this position, the opposite edge of the panel slides out of the engagement with its cover. The panel then is tilted so that it can be pulled out, over the edge of the cover. Two features make the above possible; provision of flanges which act, to some extent, as depressible springs, and making the vertical dimension 56 of the panels smaller then the vertical dimension 57 and the depth of each flange 12 or 16 less than $$\frac{\text{height } 57-\text{height } 56}{2}$$

The electronic circuit components may be mounted in a variety of ways, as described more fully in my copending application entitled Electronic Modular Units filed on April 12, 1955 and having a Serial Number 500,850 which, for completeness, is made a part of this disclosure.

Figures 5, 6:
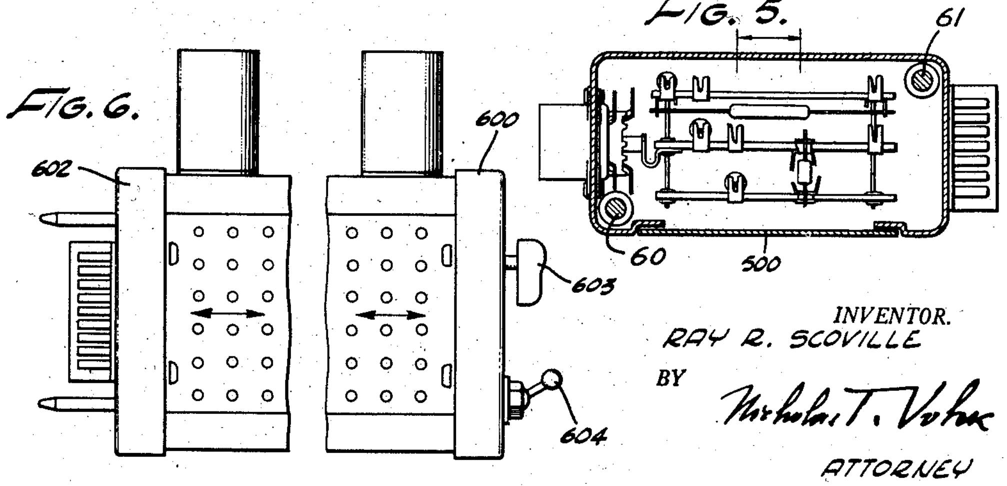
Figure 6 is a side view of a modular unit with horizontal slidable side-panels.

It should be noted that in Fig. 6 the multiple prong plug 34 is mounted on the side-wall 602 rather than on a strip 32, as illustrated in Fig. 1. Accordingly, all elements of the case, with the exception of the sliding and removable panels 44 and 45, can be used for mounting the tube sockets, plugs, or other electronic components, as illustrated, for example, in Fig. 6 at 603 and 604.

Figure 4:
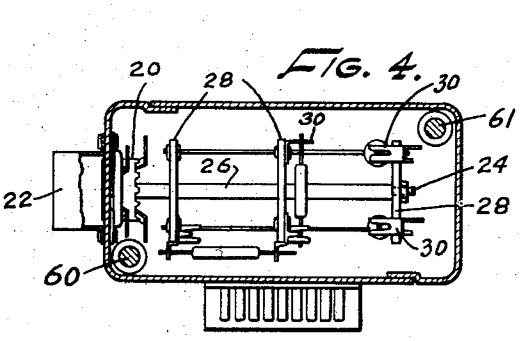

Figure 4 discloses a sectional view of the case as in Figs. 1 through 3 but with the side-panels 44 and 45 omitted, in which case one leg of the U-shaped member is extended to take the place of the omitted side-panel. This case may be used when the use of the side-panels is not deemed necessary. In all other respects this case is assembled and dismantled in the same manner as that disclosed in Figs. 1 through 3.

In Fig. 4 the electronic modular unit is mounted on the narrow side-wall of the case, and the multiple prong plug 34 is mounted on the wider wall of the same case member. The modular unit includes the elements and circuit components similar to those illustrated in Fig. 1.

Figure 5 discloses a section of the case with only one sliding side-panel 500. The insulation strips may be mounted in planes perpendicular to the drawing. In this case the strips are held together by riser wires such as those illustrated in my copending application 500,850.

Figure 6 discloses a modular unit similar to that disclosed in Figs. 1 through 3 but with the covers 600 and 602 being in vertical planes and a multiple prong plug mounted on the left side of the unit. Cover 600 has a number of electrical components, such as 603 and 604, mounted on its inner side with the control levers being visible in the figure. Either in Fig. 1 or Fig. 6 the cubic capacity of the unit may be increased by enlarging the vertical dimension of the unit in Fig. 1 and the horizontal dimension in Fig. 6 without resorting to the use of different dies.

The advantages of the disclosed modular unit and especially its cases, resides in one's ability to make the cases of different lengths without special tooling; it is possible to mount electrical components on the sides of the casing without accessibility problems; the cases permit excellent ventilation for electronic components when the side walls are made of perforated material; although the case per se may have six parts (with two sliding side-panels) all parts interlock together very snugly offering smooth outside surfaces and attractive appearance; the entire case can be taken apart by removing two small set-screws; one or two side-panels are removable without using any tools or loosening of any screws; the case can be manufactured at low cost, and can be used as a plug-in modular unit having convenient locking means; the units are readily adaptable to a large number of packaging problems.

While I have described preferred embodiments of my invention, it must be understood that the foregoing discussion is meant to be illustrative only and many modifications will suggest themselves to those skilled in the art, and these are intended to be included within the scope of my invention as set forth in the appended claims.

I claim:

1. A modular electronic unit including an electronic assembly and a case enclosing said assembly, said case comprising a plurality of members including top and bottom covers having bent-over edges, and a plurality of side-walls surrounding said assembly, at least one of said side-walls including first and second flanges spaced from each other, said flanges having first and second side-wall portions, respectively, lying in a first plane, and first and second rabbets, respectively, lying in a second plane, parallel to the first plane and inwardly spaced from said first plane; and a side-panel slidingly supported on said rabbets, side-wall portions and respective bent-over edges, adjacent to said side-panel, of said top and bottom covers, said side-panel lying in said first plane and having a height equal to the height of said side-walls minus the height of one bent-over edge of one of said covers, two posts mounted within said casing adjacent to said side-walls, and having their respective ends engaging respective covers, and means for mounting said electronic assembly on one of said members other than said side-panel, said case being a metallic case so as to act as an electric shield for said unit.

2. A modular electronic unit including an electronic assembly and a metallic case for housing said electronic assembly, said case comprising top and bottom rectangular covers, each cover having four bent-over edges, or flanges, lying in first through fourth planes, first through fourth removable side-walls lying, respectively, in said four planes; said first and third walls being opposed to each other and lying in the first and third parallel planes, the top and bottom edges of said first and third walls engaging the top and bottom covers, whereby the height of said first and third walls corresponds to the height of said case, said first and third walls comprising first and second metallic plates facing each other and lying, respectively in said first and third planes, each of said plates having a bent-over edge, lying in the second plane, and an inwardly offset rabbet; a rectangular side-panel completing the second side-wall of said case and slidably mounted on said rabbets, the height of said side-panel being less than the height of said first and third walls to permit removal of said side-panel by first sliding said panel up or down in said second plane and then sliding it outwardly in the opposite direction in a plane forming an angle with said second plane, removable posts extending between said covers at diagonally opposite corners of said case for holding said covers and side walls in position relative to one another, and means on said side panel for normally holding said side panel in predetermined position relative to said covers, said last-named means being characterized by releasing said panel from said predetermined position upon the manual inward pressing of said panel.

3. A modular electronic unit including an electronic assembly and a metallic case for housing said electronic assembly, said case comprising top and bottom rectangular covers each having four bent-over continuous cover flanges, four side-walls lying in four planes, the adjacent planes being perpendicular to each other, a single metallic bent-over member constituting the first, the second, the third and a portion of the fourth side-wall of said case, said portion including a bent-over side-wall flange and an inwardly offset rabbet at each end of said single member, the two side-wall flanges lying in the plane of said fourth side-wall, the cover flanges lying over the adjacent portions of the four side-walls; a sliding rectangular panel completing the fourth side-wall, the height of said panel being smaller than the height of said side-walls to permit up and down sliding of said panel for its removal from said case, means on said sliding panel for normally holding said panel in a predetermined position relative to said covers, said last-named means being characterized by releasing said sliding panel from said predetermined position upon the manual inward pressing of said panel, and at least one removable post mounted within said case, for rigidly attaching said covers to said single member.

4. A modular electronic unit including an electronic assembly and a case for housing said assembly, said case including top and bottom rectangular covers having four bent-over edges, first and second U-shaped side wall channels, the open ends of said channels facing each other, and said covers resting on the respective edges of said channels, each channel comprising one side wall of said case and first and second bent-over flanges comprising respective portions of side walls adjacent to said one side wall, the first flanges of the first and second channels lying in a first plane, and the second flanges of said channels lying in a second plane parallel to said first plane, each flange having an inwardly offset rabbet, first and second side panels lying in said first and second planes respectively, said first panel overlying the rabbets of the flanges lying in said first plane, said second panel overlying the rabbets of the flanges lying in said second plane, the outer surface of each side panel lying in the same plane with the outer surface of the flanges engaging said side panel through the respective rabbets, each of said side panels being mounted in sliding engagement with respect to its rabbets, the top and bottom bent-over edges of the top and bottom covers normally overlying the top and bottom edge portions of each said side panel, said first and second side panels having a height between said top and bottom covers substantially equal to the height of said U-shaped channels minus the height of the bent-over edge of one of said covers, whereby said side panels may be removed from said case by sliding said panels in the direction of their height, and manually operable latch means on said first and second panels for normally retaining and substantially centering said panels in substantially mid-position between said top and bottom covers, said latch means being characterized by releasing said panels for said sliding upon the manual inward pressing of said first and second panels.

5. A modular electronic unit including an electronic assembly and a case for housing said assembly, said case including top and bottom rectangular covers having four bent-over edges, first and second substantially U-shaped side wall channels, the open ends of said channels facing each other, and said covers resting on the respective edges of said channels, each channel comprising one side wall of said case and first and second bent-over flanges comprising respective portions of side walls adjacent to said one side wall, the first flanges of the first and second channels lying in a first plane, the second channels lying in a second plane, each flange having an inwardly offset rabbet, first and second side panels lying in said first and second planes respectively, said first panel overlying the rabbets of the flanges lying in said first plane, said second panel overlying the rabbets of the flanges lying in said second plane, each of said side panels being mounted in sliding engagement with respect to its rabbets, the top and bottom bent-over edges of said top and bottom covers normally overlying the top and bottom edge portions of each said side panel, said first and second side panels having a height between said top and bottom covers substantially equal to the height of the said U-shaped channels minus the height of the bent-over edge of one of said covers, whereby said side panels may be removed from said case by sliding said panels in the direction of their height, and two sets of outwardly projecting dimples on each panel for normally retaining each said panel in substantially mid-position between said covers, said dimples being adjacent to the edges of the respective covers when said panels are in their normal closed positions.

References Cited in the file of this patent

UNITED STATES PATENTS

| | | |
|---|---|---|
| 982,350 | Cone | Jan. 24, 1911 |
| 1,828,088 | Robinson | Oct. 20, 1931 |
| 2,051,874 | Macready et al. | Aug. 25, 1936 |
| 2,139,618 | Hall | Dec. 6, 1938 |
| 2,167,525 | Rosendale | July 25, 1939 |
| 2,265,618 | Adams | Dec. 9, 1941 |
| 2,538,070 | Wright | Jan. 16, 1951 |
| 2,579,141 | Eckert | Dec. 18, 1951 |